United States Patent
Kuo

(10) Patent No.: US 8,933,725 B2
(45) Date of Patent: Jan. 13, 2015

(54) STATE MACHINE CIRCUIT AND STATE ADJUSTING METHOD

(71) Applicant: Via Technologies, Inc., New Taipei (TW)

(72) Inventor: Hung-Yi Kuo, New Taipei (TW)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 13/963,446

(22) Filed: Aug. 9, 2013

(65) Prior Publication Data

US 2014/0306736 A1 Oct. 16, 2014

(30) Foreign Application Priority Data

Apr. 12, 2013 (TW) .............................. 102112991 A

(51) Int. Cl.
*H03K 19/173* (2006.01)
*H03K 19/0175* (2006.01)

(52) U.S. Cl.
CPC .............................. *H03K 19/017581* (2013.01)
USPC .............................................. 326/46; 326/93

(58) Field of Classification Search
CPC ................ H04W 40/00; G05B 19/045; G05B 2219/23285; G05B 2219/23289
USPC ........................................... 326/46, 37–41, 93
See application file for complete search history.

(56) References Cited

U.S. PATENT DOCUMENTS

| | | | | |
|---|---|---|---|---|
| 4,949,105 A | * | 8/1990 | Prowak | 347/112 |
| 5,796,994 A | * | 8/1998 | Chambers et al. | 713/500 |
| 5,949,251 A | * | 9/1999 | Chambers | 326/46 |
| 6,073,252 A | * | 6/2000 | Moyer et al. | 714/6.32 |
| 6,900,661 B2 | * | 5/2005 | Schlipf | 326/46 |
| 7,103,008 B2 | * | 9/2006 | Greenblat et al. | 370/258 |

* cited by examiner

*Primary Examiner* — Vibol Tan
(74) *Attorney, Agent, or Firm* — McClure, Qualey & Rodack, LLP

(57) ABSTRACT

A state machine circuit switching between multiple states is provided. The state machine circuit has: a state patch circuit for generating a patched predicted state value, a patched output value, and a selection signal according to a current state value and at least one of a second input signal, a predicted state value, and an output value of the state machine circuit; a first selection circuit for outputting the patched predicted state or the predicted state to a register according to the selection signal; and a second selection circuit for outputting the patched output value or the output value according to the selection signal, wherein the predicted state value and the output value are generated according to a first input signal and the current state value of the state machine circuit, and the predicted state value and the output value are not generated according to the second input signal.

19 Claims, 11 Drawing Sheets

| State | Encoded Value |
|-------|---------------|
| S20   | 0000          |
| S22   | 0010          |
| S24   | 0100          |
| S26   | 0101          |
| S28   | 1000          |

FIG. 6A

STATE MACHINE CIRCUIT AND STATE ADJUSTING METHOD

CROSS REFERENCE TO RELATED APPLICATIONS

This application claims priority of Taiwan Patent Application No. 102112991, filed on Apr. 12, 2013, the entirety of which is incorporated by reference herein.

BACKGROUND OF THE INVENTION

1. Field of the Invention

The present invention relates to a state machine, and in particular to a state machine circuit capable of adjusting state switching in an integrated circuit chip.

2. Description of the Related Art

Currently, synchronous circuits are usually used in integrated circuits (ICs) for controlling modules and components in the IC. However, the cost for manufacturing an IC rises significantly relative to advances in the semiconductor manufacturing processes. If states in state machines of an IC are not well-designed and state modifications are required, the cost for remanufacturing a well-designed IC is extremely high when the number of logic gates required for the modifications exceeds the number of spare cells in the IC.

FIG. 1A is a block diagram illustrating a conventional state machine circuit 100. The conventional state machine circuit 100 may comprise a logic circuit 110, a register 120, and an output circuit 130. The logic circuit 110 is configured to control the state machine circuit to switch between multiple states, wherein each state has a state value and a corresponding output value. The logic circuit 110 may further output a predicted state or also known as a next state $Q^+$. The register 120, coupled to the logic circuit 110, is configured to store a current state value of the current state QC of the state machine circuit 100. The register 120 may output the predicted state as the current state QC after a clock period. The output circuit 130 may determine an output value OUT according to the current state from the register 120 and inputs of the state machine circuit 100, wherein the aforementioned output value OUT is the output value of the state machine circuit 100. When the states of the state machine circuit 100 are not well-designed, the state machine circuit 100 may possibly be required to control switching of the states according to other additional signals, so that the design of the logic circuit 110 and the output circuit 130 needs to be alternated.

FIG. 1B is a diagram illustrating state switching of the conventional state machine circuit 100. For description, there are only two states illustrated in FIG. 1B to explain the state switching of the conventional state machine circuit 100. For example, in the original state design of the conventional state machine circuit 100, given that an input of the input signal IN of the state machine circuit 100 is SA, when the input signal SA=1, the state machine circuit 100 may switch from a current state S10 to a predicted state S11. It should be noted that the input signal IN may comprise multiple inputs. When the state design of the state machine circuit 100 is not well-designed, another input such as SB of the input signal IN may be required for the state machine circuit 100 to control state switching. For example, the state machine circuit 100 may switch from a state S10 to a state S11 given SA=SB=1 after state machine modification. Additionally, the state machine circuit 100 may keep at the state S10 given SA=1 and SB=0 after state machine modification. The number of spare cells in the IC is usually not sufficient to support such state machine modifications. In other words, it is impossible to achieve the modifications of the two paths (i.e. SA=SB=1, and SA=1, SB=0) in the IC, and the state design of the state machine circuit 100 can be only alternated by remanufacturing the IC. In view of the above, there is a demand for a state machine circuit capable of adjusting erroneous state switching or inserting extra new states in addition to the original states of the state machine circuit, thereby correcting improper state designs of the IC.

BRIEF SUMMARY OF THE INVENTION

A detailed description is given in the following embodiments with reference to the accompanying drawings.

In an exemplary embodiment, a state machine circuit switching between multiple states is provided. Each state has a state value and a corresponding output value. The state machine circuit comprises: a state patch circuit, configured to generate a patched predicted state value, a patched output value, and a selection signal according to a current state value and at least one of a second input signal, a predicted state value, and an output value of the state machine circuit; a first selection circuit, configured to output the patched predicted state or the predicted state to a register according to the selection signal; and a second selection circuit, configured to output the patched output value or the output value according to the selection signal, wherein the predicted state value and the output value are generated according to a first input signal and the current state value of the state machine circuit, and the predicted state value and the output value are not generated according to the second input signal, wherein the register stores the current state value.

In another exemplary embodiment, a state adjusting method for use in a state machine circuit is provided. The state machine circuit comprises a logic circuit and a state patch circuit, and the state machine circuit switches between multiple states. Each state has a state value and a corresponding output value. The method comprises the following steps of: generating a predicted state value of the state machine according to a first input signal and a current state value via the logic circuit; generating a patched predicted state value and a selection signal according the current state value and at least one of a second input signal, the predicted state value and an output of the state machine circuit via the state patch circuit; and outputting the patched predicted state value or the predicted state value as the current state value after a clock period according to the selection signal, wherein the output value is generated according to the first input signal and the current state value, and the predicted state value and the output value are not generated according to the second input signal.

In yet another exemplary embodiment, a state adjusting method for use in a state machine circuit is provided. The state machine circuit switches between multiple states, and each state has a state value and a corresponding output value. The method comprises the following steps of: generating a predicted state value according to a first input signal and a current state value of the state machine circuit; generating a patched predicted state value and a selection signal according to the current state value, at least one setting value corresponding to the current state value, and at least one of a second input signal, a predicted state value, and an output value; and outputting the patched predicted state value or the predicted state value as the current state value after a clock period according to the selection signal, wherein the output value is generated according to the first input signal and the current state value, and the predicted state value and the output value are not generated according to the second input signals.

BRIEF DESCRIPTION OF THE DRAWINGS

The present invention can be more fully understood by reading the subsequent detailed description and examples with references made to the accompanying drawings, wherein:

FIGS. 6A and 6B are diagrams illustrating state switching of the state machine circuit 200 according to an embodiment of the invention.

DETAILED DESCRIPTION OF THE INVENTION

The following description is made for the purpose of illustrating the general principles of the invention and should not be taken in a limiting sense. The scope of the invention is best determined by reference to the appended claims.

Figure 1A:
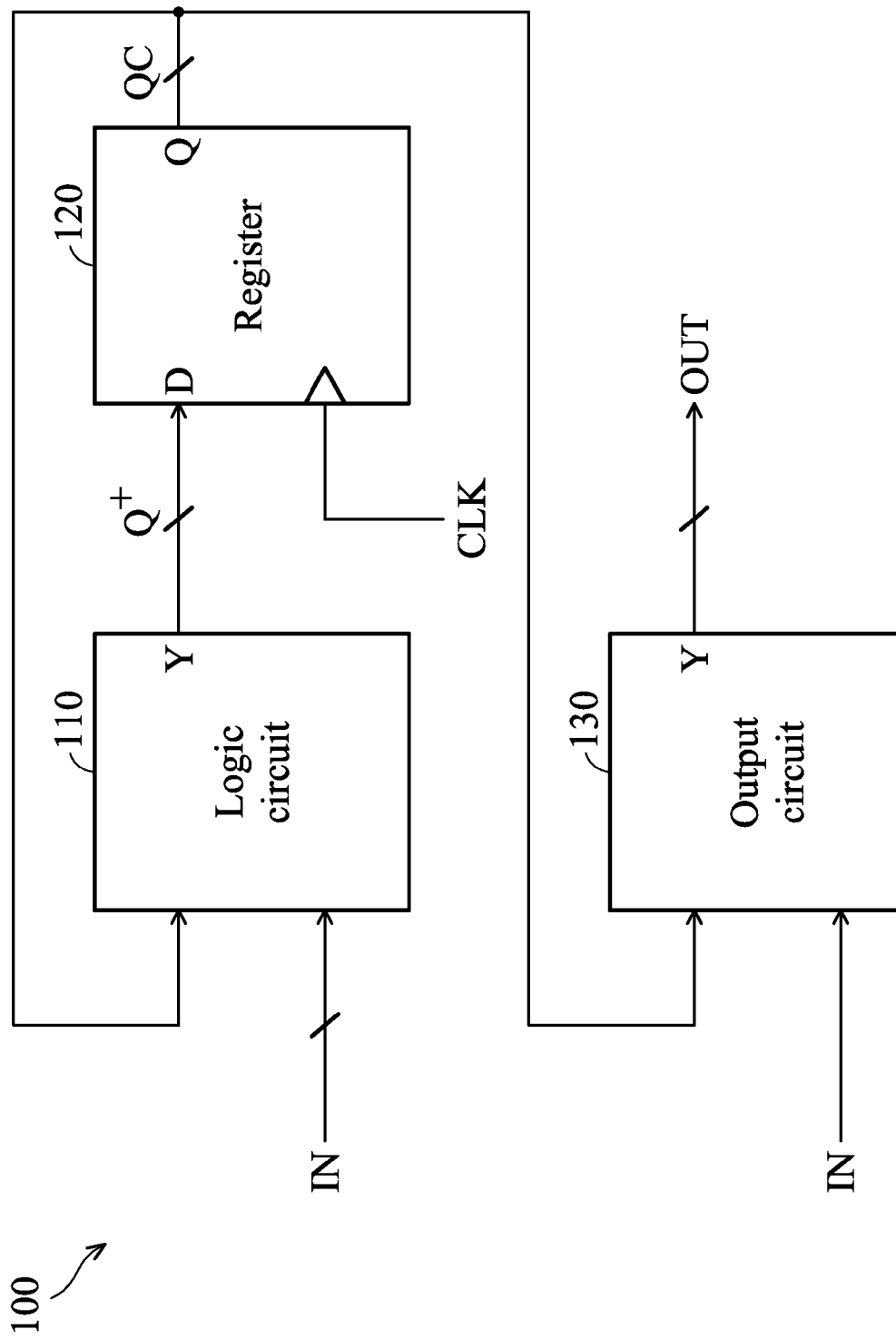
FIG. 1A is a block diagram illustrating a conventional state machine circuit 100.
Figure 1B:
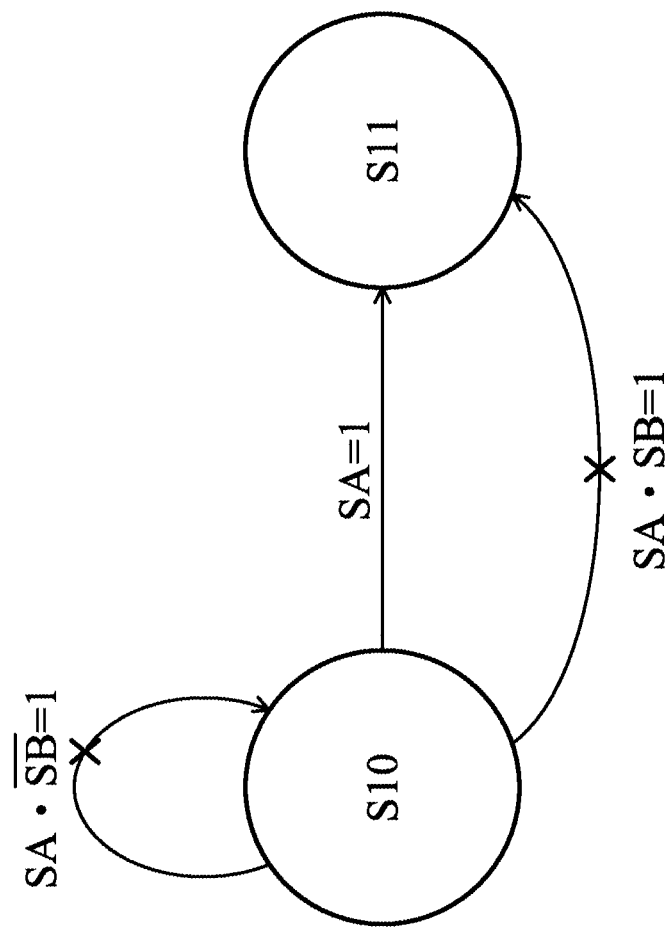
FIG. 1B is a diagram illustrating state switching of the conventional state machine circuit 100.
Figure 2:
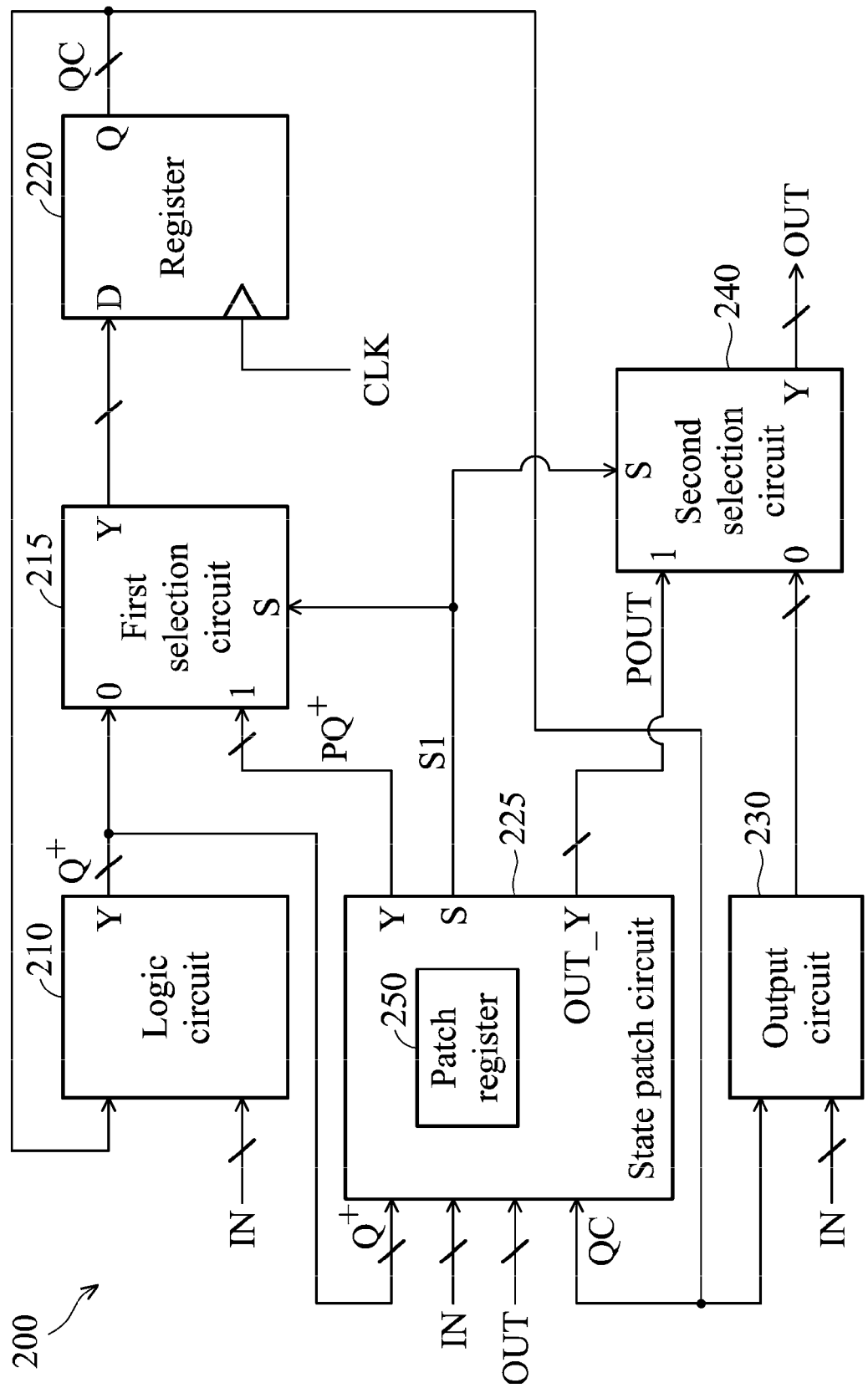
FIG. 2 is a block diagram illustrating a state machine circuit 200 according to an embodiment of the invention.

FIG. 2 is a block diagram illustrating a state machine circuit 200 according to an embodiment of the invention. The state machine circuit 200 may comprise a logic circuit 210, a first selection circuit 215, a register 220, a state patch circuit 225, an output circuit 230, and a second selection circuit 240. Referring to both FIG. 1 and FIG. 2, the logic circuit 210, the register 220, and the output circuit 230 of the state machine circuit 200 correspond to the logic circuit 110, the register 120, and the output circuit 130 of the state machine circuit 100, respectively. The details of the components will not be described here. In addition to the components of the state machine circuit 100, the state machine circuit 200 may further comprise other components, such as the first selection circuit 215, the state patch circuit 225, and the second selection circuit 240. For example, the first selection circuit 215, the state patch circuit 225, and the second selection circuit 240 can be used to provide an appropriate remedy for certain states when such states of the state machine circuit 200 are erroneously designed or extra states in addition to the original states should be inserted. Although there is only one state patch circuit 255 illustrated in FIG. 2, the state machine circuit 200 may also comprise multiple independent state patch circuits in parallel for correcting state switching or inserting extra new states. The details will be described later. Specifically, the cost for manufacturing ICs is extremely high. If the state machine circuit 200 of the invention is designed and placed into the ICs in advance, the erroneously designed states of the logic circuit 210 can be corrected by using firmware or software to update the output value or the predicted state of the state machine circuit 200, thereby preventing the erroneous state switching of the state machine circuit 200 and saving the extremely high cost of remanufacture of the ICs with a patched state machine circuit. Additionally, each state may indicate corresponding operation of the state machine circuit 200 in the following sections for description. For those skilled in the art, it is appreciated that each state of a state machine can be expressed by a state value. For example, the state S10 in FIG. 1B can be expressed by a state value encoded by a number of 0010. In addition, the current state QC can be expressed by a current state value, and the predicted state $Q^+$ can be expressed by a predicted state value, and so on. In other words, each state can be expressed by an individual state value (or encoding value) different from each other.

In an embodiment, each state patch circuit 225 may further comprise a patch register 250, and the patch register 250 can be implemented by multiple registers, so that the state machine circuit 200 may switch to a patched predicted state $PQ^+$ and output a patched output value POUT. In an embodiment, the patch register 250 can be implemented by using components, such as ROM, EPROM, EEPROM, or flash memory, but the invention is not limited thereto. In another embodiment, the patch register 250 can be implemented by multiple registers loaded with data before operation of the state machine circuit 200 (e.g., loaded with data from the boot ROM), and the details will be described in the embodiment of FIG. 3. Referring to FIG. 1B, when another input signal SB is used to control state switching of the state machine circuit 100 to switch from the state S10 to S11 with SA=SB=1, corresponding conditions of the signals or states to be patched (e.g. current state is S10 with SA=SB=1) and modifications associated with the corresponding conditions (e.g. patched predicted state is S11) may be stored in the patch register 250. Details of FIG. 2 will be further discussed with FIG. 3 and FIG. 4.

Figure 3:
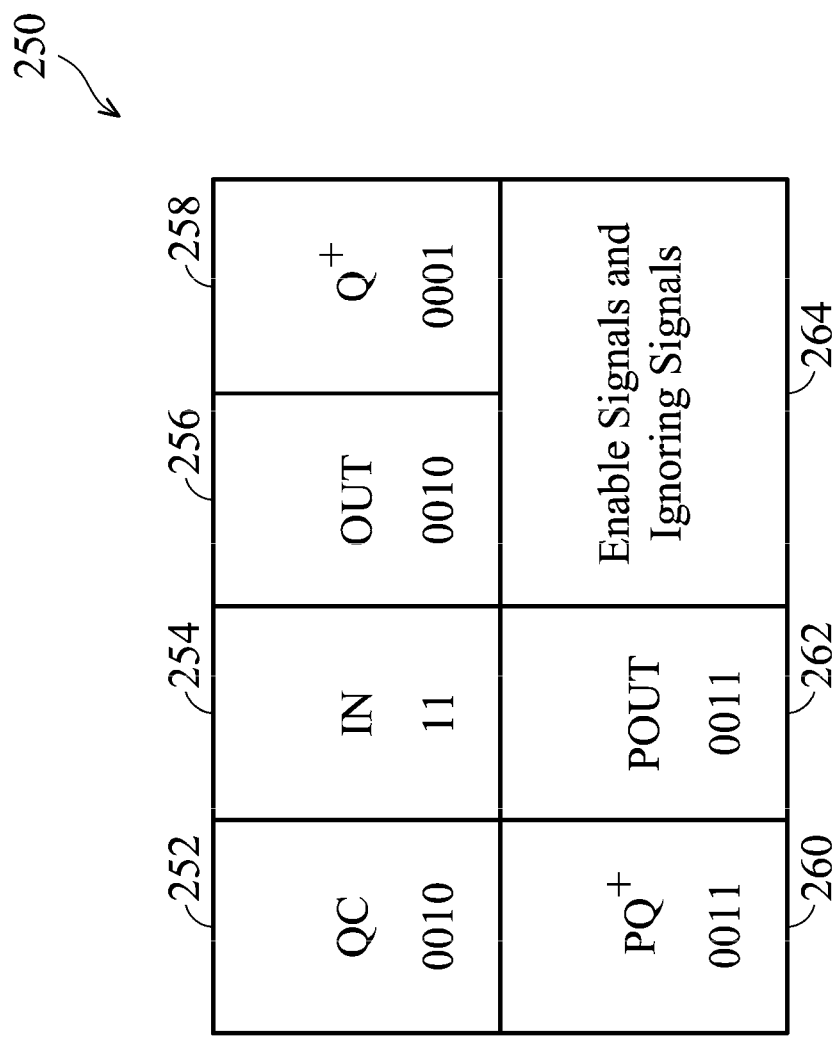
FIG. 3 is a diagram illustrating a configuration of the patch register 250 according to an embodiment of the invention.

FIG. 3 is a diagram illustrating a configuration of the patch register 250 according to an embodiment of the invention. As illustrated in FIG. 3, the patch register 250 may be divided into multiple subsets 252~264, where each subset may be implemented by multiple registers, which stores corresponding signals or states. The corresponding conditions of the signals or states to be patched, which are matched with specific criteria by the state patch circuit 225, and the modifications corresponding to the matched specific criteria are stored in the patch register 250. The aforementioned specific criteria may comprise the current state QC, the input signal IN, the output value OUT, and the predicted state $Q^+$, and the modifications corresponding to the matched criteria may comprise the patched predicted state $PQ^+$ and the patched output value POUT. For example, the subset 252 corresponds to the current state QC; the subset 254 corresponds to the input signal IN; the subset 256 corresponds to the output value OUT; the subset 258 corresponds to the predicted state $Q^+$; the subset 260 corresponds to the patched predicted state $PQ^+$; the subset 262 corresponds to the patch output value POUT; and the subset 264 corresponds to the enable signal or ignore signal of each component of the state patch circuit 225 (see below). For example, in the modifications required in FIG. 1B, the subset 252 stores a setting condition (e.g. 0010) associated with the current state QC as S10, and the subset 254 stores the setting condition given SA=SB=1 of the input signal IN (e.g. 11 in 2 digits). The subset 260 stores the state value (e.g. 0011) of the patched predicted state $PQ^+$ as S11. The patch register 250 can be implemented by multiple registers loaded with data (e.g. pre-written by a boot ROM) before operation of the state machine circuit 200. Taking an x86 PC for an example, each component in the x86 PC can not operate until the reset signal of the PCI-E bus is asserted after the x86 PC is booted up. A boot ROM may pre-write the required patch settings values into the corresponding subset of the patch register 250 after the x86 PC is booted up. Accordingly, each component may operate according to the loaded setting value in the corresponding subset of the patch register 250 after the reset signal of the PCI-E bus is asserted.

Referring to FIG. 2 again, the operation of the first selection circuit 215, the state patch circuit 225, and the second selection circuit 240 of the state circuit machine 200 will be described. In an embodiment, each state patch circuit 225 may receive the input signal IN and the current state QC of the state machine circuit 200, thereby generating a patched predicted state $PQ^+$ and a patched output value POUT according to the received input signal IN and the current state QC. Each state patch circuit 255 may further output a selection signal S1 to the first selection circuit 215 and the second selection circuit 240 simultaneously. In another embodiment, each state patch circuit 225 may receive the input signal IN, the output value OUT, the current state QC and/or the predicted state $Q^+$ of the state machine circuit 200, thereby generating a patched predicted state $PQ^+$ and a patched output value POUT according to the received signals. Each state patch circuit 225 may further output a selection signal S1 to the first selection circuit 215 and the second selection circuit 240 simultaneously. In yet another embodiment, each state patch circuit 25 may receive the current state QC, and at least one of the input signal IN, the predicted state $Q^+$ and the output value OUT, thereby generating a patched predicted state $PQ^+$ and a patched output value POUT according to the received signals. Each state patch circuit 225 may further output a selection signal S1 to the first selection circuit 215 and the second selection circuit 240 simultaneously. The first selection circuit 215 may select the patched predicted state $PQ^+$ from the state patch circuit 225 or the predicted state $Q^+$ from the logic circuit 210 according to the selection signal S1, and output the selected state to the register 220. For example, when the selection signal S1 is at a low logic state, the first selection circuit 215 may output the predicted state $Q^+$ from the logic circuit 210. Conversely, when the selection signal S1 is at a high logic state, the first selection circuit 215 may output the patched predicted state $PQ^+$ from the state patch circuit 225. The register 220 may output the current state QC after a clock period. The second selection circuit 240 may select the patched output value POUT from the state patch circuit 225 or the output value OUT from the output circuit 230. For example, when the selection signal is at a low logic state, the second selection circuit 240 may output the output value OUT from the output circuit 230. Conversely, when the selection signal is at a high logic state, the second selection circuit 240 may output the patched output value POUT from the state patch circuit 225. It should be noted that the output of the second selection circuit 240 is exactly the output of the state machine circuit 200. Briefly speaking, when the state patch circuit 225 has detected the matched criteria for the signals or states to be patched, the first selection circuit 215 and the second selection circuit 240 may respectively output the patched predicted state $PQ^+$ and the patched output value POUT from the state patch circuit 225 according to the selection signal S1, thereby patching the original predicted state $Q^+$ and the output value OUT.

Figure 4:
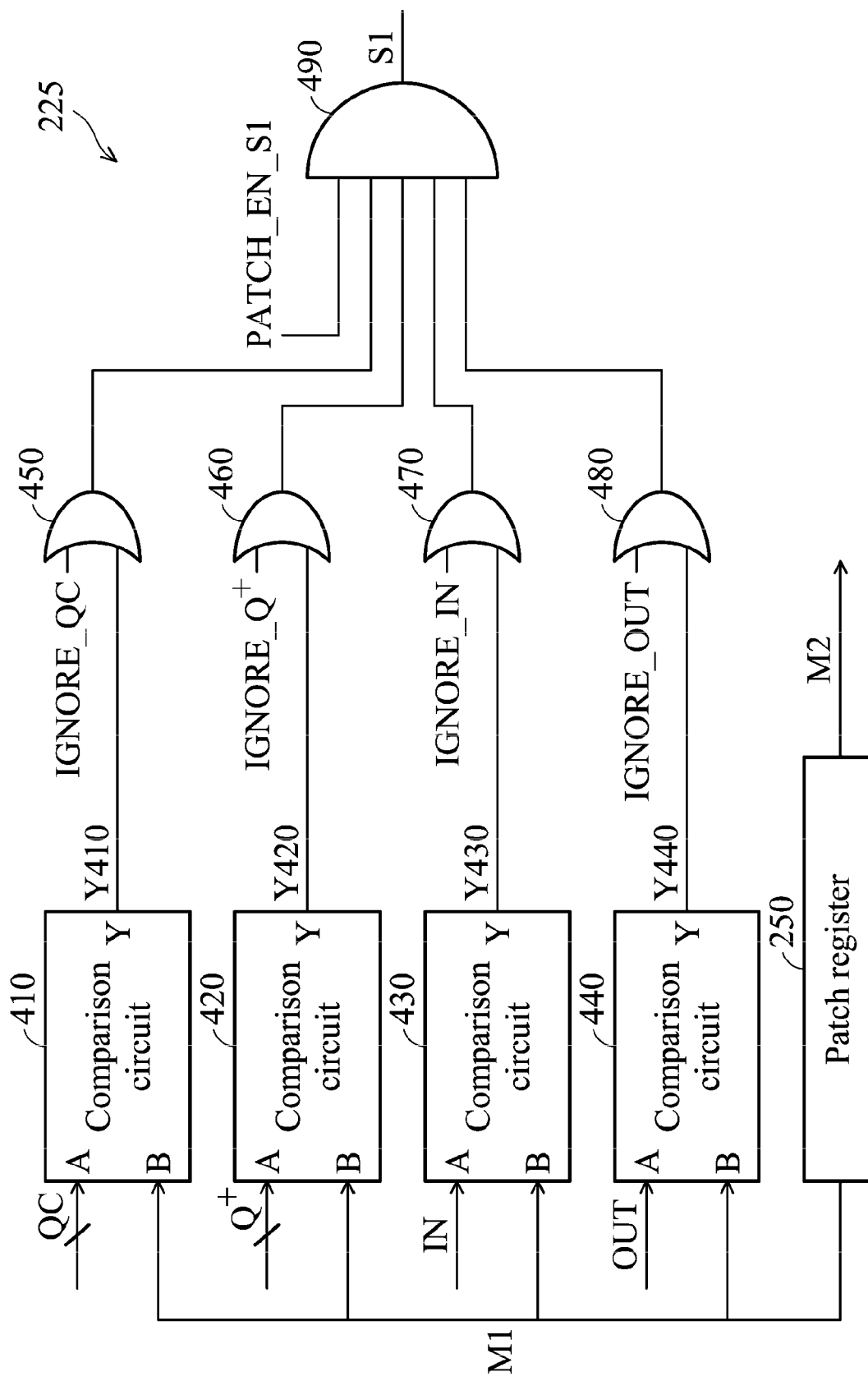
FIG. 4 is a schematic block diagram of a state patch circuit 225 according to an embodiment of the invention.

FIG. 4 is a schematic block diagram of a state patch circuit 225 according to an embodiment of the invention. As illustrated in FIG. 4, each state patch circuit 225 may comprise multiple comparison circuits (e.g. comparison circuits 410~440) and a patch register 250. Each comparison circuit, which is coupled to the corresponding signals/states and the corresponding subset(s) of the patch register 250, is configured to compare the corresponding signals/states with the criteria of the signals/states to be patched stored in the patch register 250. For example, the comparison circuit 410 is for comparison of the current state stored in the register 220. Thus, the first input terminal A of the comparison circuit 410 is coupled to the register 220 which stores current state QC, and the second input terminal B of the comparison circuit 410 is coupled to the subset 252 of the patch register 250, which stores data of the matching criterion of the current state QC to be patched. The comparison circuit 420 is for the comparison of the predicted state of the logic circuit 210. Thus, the first input terminal A of the comparison circuit 420 is coupled to the output terminal of the logic circuit 210 which outputs the predicted state $Q^+$, and the second input terminal B of the comparison circuit 420 is coupled to the subset 258 of the patch register which stores data of the matching criterion of the predicted state $Q^+$ to be patched. The comparison circuit 430 is for comparison of the input signal of the state machine circuit 200. Thus, the first input terminal A of the comparison circuit 430 is coupled to the input signal IN of the state machine circuit 200 (e.g. the aforementioned input signals SA and SB), and the second input terminal B of the comparison circuit 430 is coupled to the subset 254 of the patch register 250 which stores data (e.g. 11 as mentioned above) of the matching criterion of the input signal IN to be patched. The comparison circuit 440 is for comparison of the output signal of the state machine circuit 200. Thus, the first input terminal A of the comparison circuit 440 is coupled to the output OUT of the state machine circuit 200, and the second input terminal B of the comparison circuit 440 is coupled to the subset 256 of the patch register 250 which stores data of the matching criterion of the output value OUT to be patched. It should be noted that the subsets 252, 254, 256 and 258 of the patch register 250 are sets of registers which store the current state, the input signal, the output value and the predicted state, respectively. For example, setting data M1 may comprise the setting values of the current state, the predicted state, the input signal and the output value, and the second input terminals of the comparison circuits 410~440 may each use a corresponding setting value from the setting data M1. It should be noted that the comparison circuits 410~440 may have a multi-bit input terminal (e.g. multiple input signals SA and SB of the input signal IN), which may be compared with criteria of multiple signals or states. When the signals or states match the setting values to be patched, the comparison circuits 410~440 may generate corresponding control signals Y410~Y440 which are at a high logic state. The actual number of bits of each subset of the patch register 250 is determined based on the requirements of state design. While designing a state machine circuit, some signals or states, whose use in the subsequent modification of the state machine is highly probable, may be preserved. Taking FIG. 1B for example, the comparison circuit 430 may determine whether the input signal IN comprises SA=1 and SB=1, and the comparison circuit 410 may determine whether the current state QC is S10. Meanwhile, if another input terminal, such as the input terminal SC, is preserved in the comparison circuit 430, the value stored in the subset 254 corresponding to the input signal IN may be expressed as a specific character value (e.g. FFFF in hex) to ignore the input signal SC during comparison, such that the comparison result is not affected by the input signal SC. If the comparison circuit 430 determines that the input signal IN comprises SA=1 and SB=1, the control signal Y430 is at a high logic state. If the comparison circuit 410 determines that the current state QC is S10, the control signal Y410 is at a high logic state. In another embodiment, if each state patch circuit 225 is designed for receiving the input signal IN and the current state QC of the state machine circuit 200 only, the state patch circuit 225 may merely comprise the corresponding comparison circuits 410 and 430.

In the aforementioned embodiment, the comparison circuits 410~440 may generate corresponding control signals Y410~Y440, respectively. The control signals Y410~Y440 are coupled to an input terminal of the OR gates 450~480, respectively. Another input terminal of the OR gates 450~480 is coupled to a respective ignoring signal corresponding to each signal or state, such as IGNORE_QC, IGNORE_$Q^+$, IGNORE_IN, and IGNORE_OUT. Specifically, the state patch circuit 225 may activate comparison functions corresponding to the current state, the predicted state, the input signal and/or the output value according to the ignoring signals IGNORE_QC, IGNORE_$Q^+$, IGNORE_IN, and IGNORE_OUT, respectively. For example, when an ignoring signal stored in the patch register 250 is at a high logic state, the output of the corresponding OR gate is thus at a high logic state so that the control signal generated by the comparison results from the corresponding comparison circuit is ignored. Taking FIG. 1B for example, the ignoring signals IGNORE_$Q^+$ and IGNORE_OUT are set to a high logic state, and thus the comparison results from the comparison circuits 420 and 440 will be ignored, so that the state patch circuit 225 may control state switching according to the current state QC and the input signal IN only. In addition, the patch register 250 of the state patch circuit 225 may further output setting data M2, which comprise the patched predicted state $PQ^+$ (i.e. outputted to the first selection circuit 215) stored in the subset 260 of the patch register 250 and the patched output value POUT (i.e. outputted to the second selection circuit 240) stored in the subset 262 of the patch register 250. Accordingly, when the criteria of the signals or states to be patched are tenable, the first selection circuit 215 and the second selection circuit 240 may output the patched predicted state $PQ^+$ and the patched output value POUT according to the selection signal 51, respectively.

Referring to both FIG. 2 and FIG. 4, in an embodiment, the output terminals of OR gates 450~480 are coupled to multiple input terminals of the AND gate 490, and a selection signal S1 is generated after the operation of the AND gate 490. In another embodiment, an input terminal of the AND gate 490 is coupled to an enable signal PATCH_EN_S1 (e.g. from the corresponding subset 264 of the patch register 250) for controlling the output of the AND gate 490. A selection signal S1 is generated by the AND gate 490 after the AND operation of the outputs of the OR gates 450~480 and the enable signal PATCH_EN_S1. When the enable signal PATCH_EN_S1 is at a high logic state, the patch function is enabled. When the enable signal PATCH_EN_S1 is at a low logic state, the patch function is disabled. Accordingly, when each signal or state matches the setting values to be patched or is set as ignored given that the enable signal PATCH_EN_S1 is at a high logic state (e.g. enabling the patch function), the selection signal S1 is at a high logic state. Otherwise, the selection signal S1 is at a low logic state. It should be noted that the selection signal S1 is coupled to the selection terminal S of the first selection circuit 215 and the selection terminal S of the second selection circuit 240, simultaneously. In an embodiment, when the selection signal S1 is at a high logic state, it may indicate that the first selection circuit 215 may select the patched predicted state $PQ^+$ from the state patch circuit 225 in response to the selection signal S1, and the second selection circuit 240 may select the patched output value POUT from the state patch circuit 225 in response to the selection signal S1. In other words, the output value of the state machine circuit 200 is in accordance with the patched output value POUT from the state patch circuit 225 when the patch function is enabled.

It should be noted that the state machine circuit 200 may comprise multiple independent state patch circuits 225 in parallel. For example, each state patch circuit may output selection signals S1, S2, S3 and S4. In addition, each state patch circuit may also output corresponding patched predicted state $PQ^+$ and patched output value POUT according to a respective patch register 250. The selection signal, the patched predicted state, and the patch output value of each state patch circuit may be outputted to the first selection signal 215 and the second selection circuit 240 in a similar way as described above. The first selection circuit 215 may select one of the patch predicted states from the corresponding state patch circuit 225 or the predicted state from the logic circuit 210 according to the multiple sets of selection signals. The second selection circuit 240 may select one of the patched output values from the corresponding state patch circuit 225 or the output value from the output circuit 230 according to the multiple sets of selection signals. Each of the independent state patch circuits operated in parallel may correspond to a design bug, and can be coordinated with each other to overcome more design bugs of the IC (details will be discussed later).

Figure 5A:
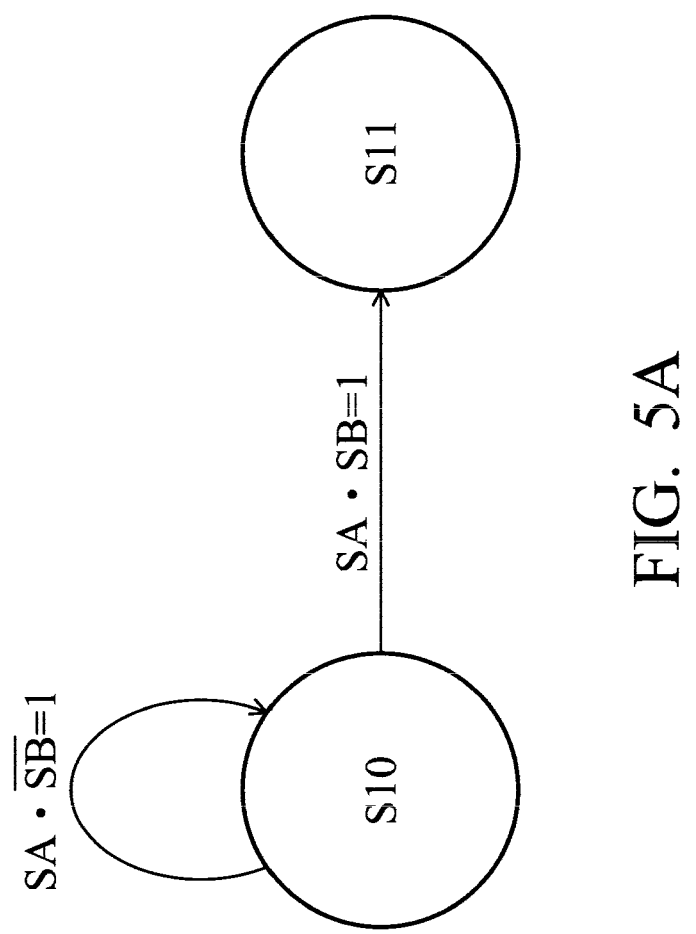
FIG. 5A is a diagram illustrating state switching of the state machine circuit 200 according to an embodiment of the invention.

FIG. 5A is a diagram illustrating state switching of the state machine circuit 200 according to an embodiment of the invention. Referring to FIG. 1B, FIG. 4 and FIG. 5A, the conventional state machine circuit 100 may switch to the state S11 from the state S10 given that an input SA of the input signal satisfies SA=1, as illustrated in FIG. 1B. However, if the state switching of the conventional state machine circuit 100 does not fit the design requirements or is erroneously designed, an appropriate modification for the state switching is required. For example, the modified state machine may only switch to the state S11 from the state S10 given SA·SB=1, and keep at the state S10 given SA·$\overline{SB}$=1, as illustrated in FIG. 5A. Accordingly, the corresponding subsets of the patch register 250 may be set for the current state QC and the inputs SA and SB of the input signal N. For example, the input of the comparison circuit 430 of the state patch circuit 225 may be two bits SA and SB. Since the condition SA~SB=1 only stands when SA=SB=1, the comparison circuit 430 may compare the input values of SA and SB with the setting values (e.g. SASB=11) stored in the corresponding subset (e.g. the subset 254) of the patch register 250. The input of the comparison circuit 410 may be an encoded value of the current state QC (e.g. a 4-digit value 0010 representing the state S10). Then, the comparison circuit 410 may compare the encoded value of the current state QC with the setting value (e.g. Q=0010) stored in the corresponding subset (e.g. the subset 252) of the patch register 250.

The output of the comparison circuit 430 is 1 (i.e. high logic state) only when the input values of SA and SB match with the setting value of the corresponding subset of the patch register 250. The output of the comparison circuit 410 is 1 (i.e. high logic state) only when the encoded value of the current state QC matches the setting value of the corresponding subset of the patch register 250. Since comparison is only required for the signals SA·SB and Q, other comparison results of the predicted state $Q^+$ and the output value OUT can be ignored. That is, the ignoring signals IGNORE_$Q^+$ and IGNORE_OUT associated with the corresponding subset of the patch register 250 are at a high logic state. In yet another embodiment, if each state patch circuit 225 merely receive the input signal IN and the current state QC of the state machine circuit 200, the state patch circuit 255 may only comprise comparison circuits 410 and 430 and OR gates 450 and 470 without other comparison circuits and OR gates. The patched predicted state $PQ^+$ (e.g. corresponding to the state value of the state S11) stored in the subset (e.g. subset 260) of the patch register 250 is further outputted to the first selection circuit 215. When the enable signal PATCH_EN_S1 is at a high logic state, the first selection circuit 215 may output the patched predicted state $PQ^+$ to the register 220 according to the selection signal S1. That is, the erroneous predicted state in the logic circuit 210 may be corrected to the patched predicted state.

Figure 5B:
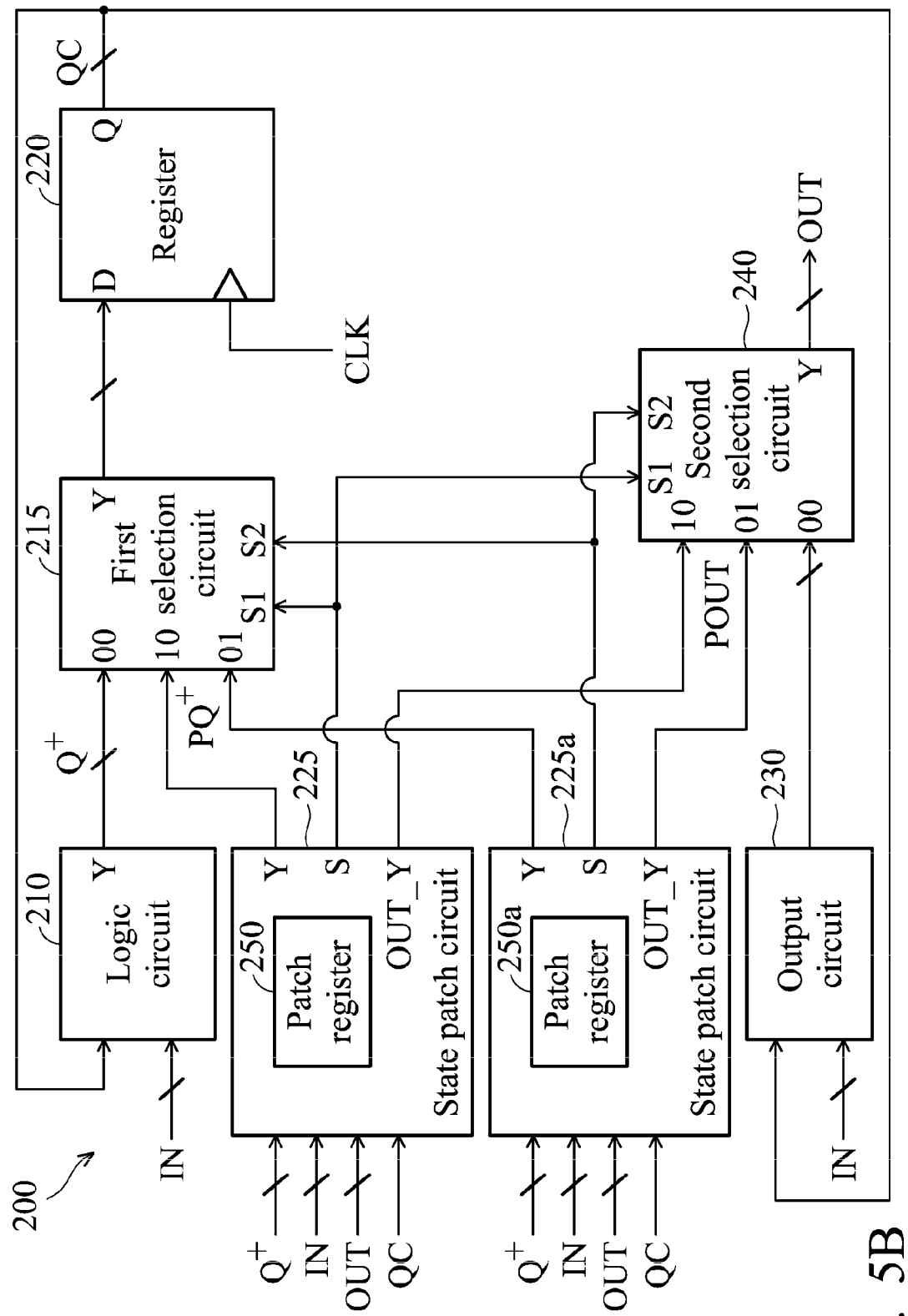
FIG. 5B is a block diagram illustrating the state machine circuit 200 according to another embodiment of the invention.

Specifically, when modifications are required for state switching of the logic circuit 210, the corresponding setting values of the patch register 250 can be alternated depending on actual conditions, and the state switching of the logic circuit 210 may be corrected by the alternated settings values of the patch register 250 and corresponding state patch circuits 225. FIG. 5B is a block diagram illustrating the state machine circuit 200 according to another embodiment of the invention. In the embodiment, if the criterion for state switching from the state S10 to the state S11 is modified from the condition "SA=1" to the condition "SA=1 and SB=1" and the state is kept at S10 with the condition "SA=1 and SB=0", there are two state patch circuits 225 and 225a required to determine whether the aforementioned conditions are tenable, as illustrated in FIG. 5B. The state patch circuits 225 and 225a may have the respective patch registers 250 and 250a with a configuration as illustrated in FIG. 3. The patch register 250 may be divided into multiple subsets 252~264, and the patch register 250a may be also divided into multiple subsets 252a~264a, where the condition corresponding to a signal or state for each subset is described above. The state patch circuit 225 may determine whether to enter the predicted state S11 (i.e. controlling the first selection circuit 215 to output the patched predicted state $PQ^+$=0011 to the register 220 or not by the selection signal S1) according to the input signal IN (i.e. determined whether SA=1 and SB=1 by the comparison circuit 430) and the current state QC (i.e. determined whether QC=0010 by the comparison circuit 410). The state patch circuit 225a may determine whether to enter the predicted state S10 (i.e. controlling the first selection circuit 215 whether to output the patched predicted state $PQ^+$=0010 to the register 220 or not by the selection signal S2) according to the input signal IN (i.e. determined whether SA=1 and SB=0 by the comparison circuit 430) and the current state QC (i.e. determined whether QC=0010 by the comparison circuit 410).

Figure 5C:
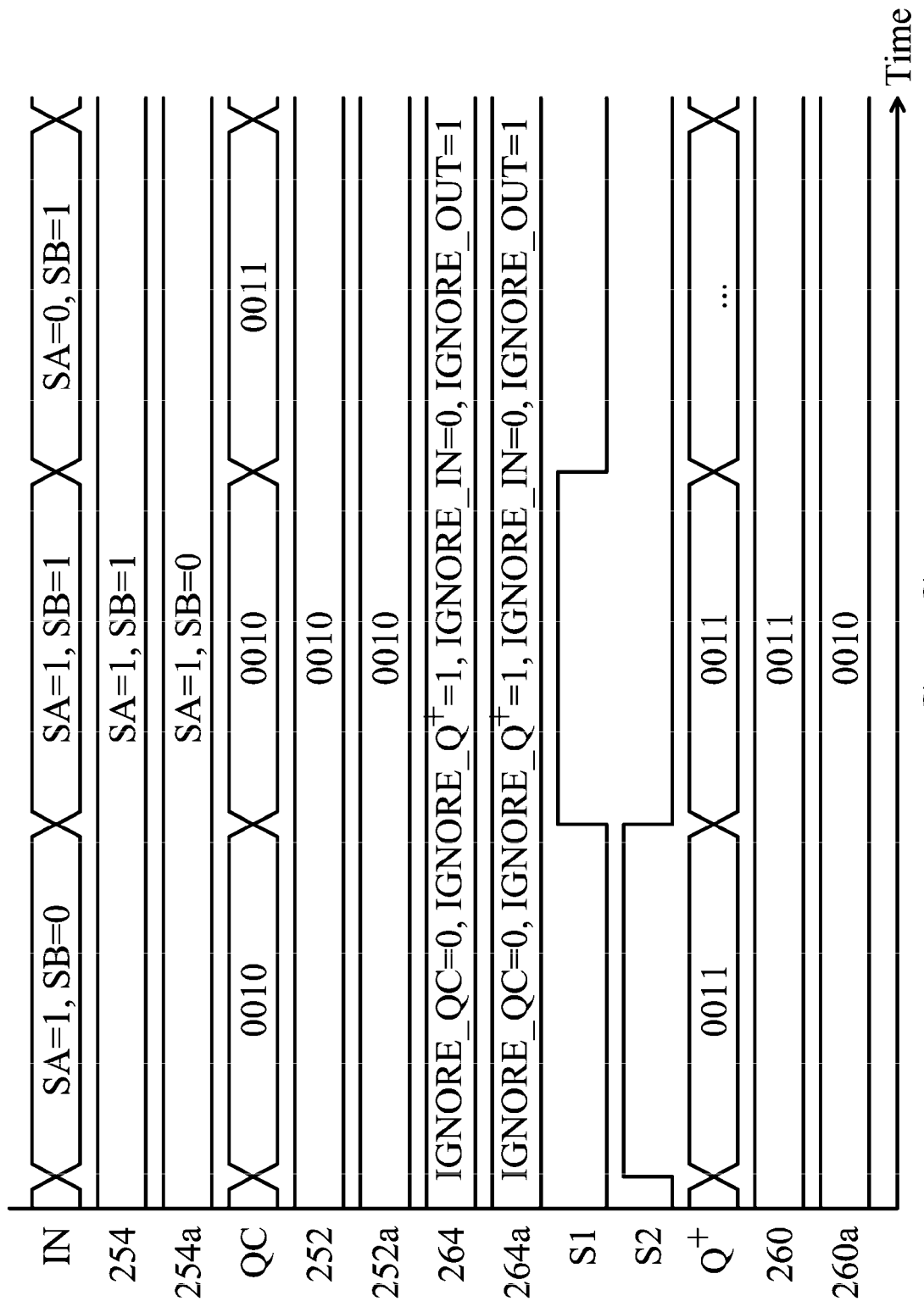
FIG. 5C is a diagram illustrating variation of each signal or state of the state machine circuit 200 over time according to the embodiment in FIGS. 5A~5B of the invention.

FIG. 5C is a diagram illustrating variation of each signal or state of the state machine circuit 200 over time according to the embodiment in FIGS. 5A~5B of the invention. Referring to FIGS. 5A, 5B and 5C, the corresponding condition "SA=1 and SB=1" of the input signal IN to be patched by the state patch circuit 225 is stored in the subset 254 of the patch register 250 of the state patch circuit 225. The condition "QC=0010" corresponding to the current state QC is stored in the subset 252. The ignoring signals IGNORE_QC=0, IGNORE_$Q^+$=1, IGNORE_IN=0, and IGNORE_OUT=1 are stored in the subset 264 to ignore the comparison results of the predicted state $Q^+$ and the output value OUT. The value of the modified patched predicted state $PQ^+$=0011 is stored in the subset 260. The corresponding condition "SA=1 and SB=0" of the input signal IN to be patched by the state patch circuit 225a is stored in the subset 254a of the patch register 250a of the state patch circuit 225a. The ignoring signals IGNORE_QC=0, IGNORE_$Q^+$=1, IGNORE_IN=0, and IGNORE_OUT=1 are stored in the subset 264a to ignore the comparison results of the predicted state $Q^+$ and the output value OUT. The value of the modified patched predicted state $PQ^+$=0010 is stored in the subset 260a. When the input signal IN is given as "SA=1 and SB=0" and the current state value QC is 0010, the comparison circuits (as illustrated in FIG. 4) of the state patch circuit 225a may determine that the criteria for alternating state switching are tenable, so that the selection signal S2 outputted by the state patch circuit 225a is at a high logic state to control the first selection circuit 215 to output the patched predicted state $PQ^+$=0010 to the register 220, so that the current state of state machine circuit 200 is kept at the state S10. With other combinations of input values of the input signal IN and the current state QC, the selection signal S2 outputted by the state patch circuit 225a is at a low logic state without performing any modification to state switching of the state machine circuit 200. When the input signal IN is given as "SA=1 and SB=1" and the current state value QC is 0010, the comparison circuits (as illustrated in FIG. 4) of the state patch circuit 225 may determine that the criteria for alternating state switching are tenable, so that the selection signal S1 outputted by the state patch circuit 225 is at a high logic state to control the first selection circuit 215 to output the patched predicted state $PQ^+$=0011 to the register 220, so that the state machine circuit 200 may enter the state S11. With other combinations of input values of the input signal IN and the current state QC, the selection signal S1 outputted by the state patch circuit 225 is at a low logic state without performing any modification to state switching of the state machine circuit 200. When the selection signals S1 and S2 are both at a low logic state, the first selection circuit 215 may output the original predicted state $Q^+$ to the register 220. In the aforementioned embodiment, there is a corresponding output value (not shown) for each state value, and the operation of the second selection circuit 240 are similar to that of the first selection circuit 215. In an embodiment, the setting values of the enable signals PATCH_EN_S1 and PATCH_EN_S2 (i.e. the signal PATCH_EN_S2 is not shown, and the configuration of PATCH_EN_S2 is similar to PATCH_EN_S1 in FIG. 4) are stored in the subsets 264 and 264a to activate/deactivate the state switching functions of the state patch circuits 225 and 225a, respectively.

Figure 6B:
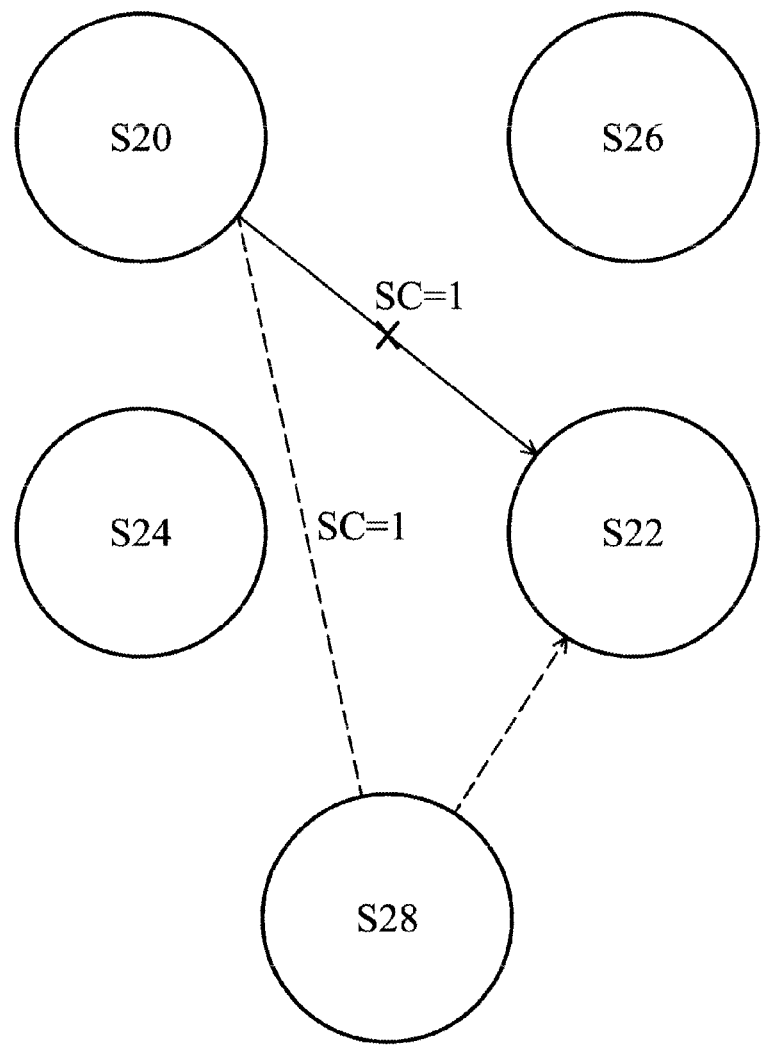

FIGS. 6A and 6B are diagrams illustrating state switching of the state machine circuit 200 according to an embodiment of the invention. In an embodiment, the state machine circuit 200 may further insert extra new states in addition to modifying state switching of the logic circuit 210. As illustrated in FIG. 6A, there are only four states S20~S26 in the original state design of the logic circuit 210, where the encoded values of the states are 0000, 0010, 0100 and 0101, respectively. Then, a new state S28 having an encoded value 1000 is required to be added in addition to the original four states. For example, the state machine circuit 100 may switch to the state S22 from the state S20 given the input signal SC=1 in the original state design of the state machine circuit 100. Nevertheless, the state switching in the original state design of the state machine circuit 100 may be erroneous and require correction. For example, the state machine circuit 100 should switch to the newly added state S28 from the state S20 given the input signal SC=1, and then switch to the state S22 from the state S28 after one clock period, as illustrated in FIG. 6B. However, the newly added state S28 is unknown to the logic circuit 210, and another state patch circuit 225a is required to determine whether the criteria for adding the new state S28 are tenable, as illustrated in FIG. 5B. For example, a state patch circuit 225 may determine whether to enter the new predicted state S28 (i.e. controlling the first selection circuit

215 whether to output the patched predicted state PQ⁺=1000 to the register 220 by the selection signal S1) according to the input signal SC (i.e. determined whether the input signal SC=1 by the comparison circuit 430) and the current state QC (i.e. determined whether the current state QC=0000 by the comparison circuit 410). When the state machine circuit 200 has entered the state S28 (i.e. QC=1000), another state patch circuit 225a may control the state machine circuit 200 to enter a predicted state S22 (i.e. controlling the first selection circuit 215 to output the patched predicted state PQ⁺=0010 to the register 220 by the selection signal S2) corresponding to the current state S28 after one clock period according to the current state QC (i.e. a determined whether the current state QC=1000 by a comparison circuit 410a (not shown) of the state patch circuit 225a), as illustrated in FIG. 6B. Accordingly, the original state design of the logic circuit 210 is modified or replaced by the new state and the new state switching path of the state patch circuit 225.

Figure 7:
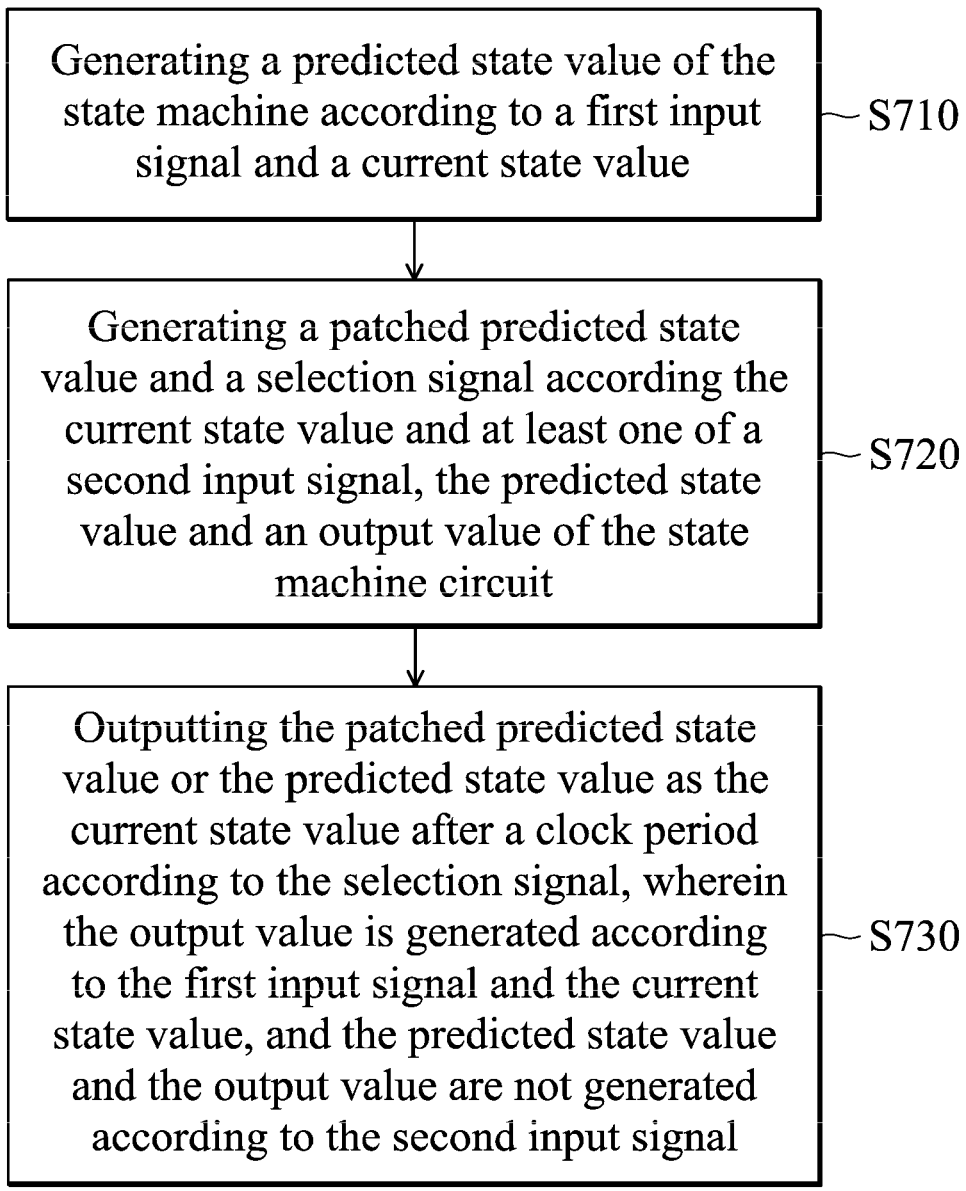
FIG. 7 is a flow chart illustrating the state adjusting method according to an embodiment of the invention.

FIG. 7 is a flow chart illustrating the state adjusting method according to an embodiment of the invention. In step S710, the logic circuit 210 may output a predicted state value of a predicted state of the state machine circuit 200 according to a first input signal (i.e. the input signal IN) and a current state value (i.e. encoded value of the current state QC) of a current state of the state machine circuit 200. The state patch circuit 225 may generate a corresponding patched predicted state value and a selection signal according to the current state value and at least one of a second input signal, the predicted state value, and an output value in step 720. In step S730, the first selection circuit 215 may output the patched predicted state value or the predicted state value as the current state value after a clock period according to the selection signal, wherein the output value is generated according to the first input signal and the current state value, and the predicted state value and the output value are not generated according to the second input signal.

In view of the above, a state machine circuit pre-designed and placed in an integrated circuit is described in the invention. The state machine circuit of the invention may properly update the output value or the predicted state of the state machine by firmware or software when the state machine is erroneously designed, thereby saving the extremely high cost of remanufacturing ICs having the updated state machine. The pre-placed state patch circuit of the invention may generate a patched predicted state and a patched output value according to at least one of the input signal, the output value, the current state, and the predicted state, thereby allowing sufficient flexibility for modifications of the state machine of the IC.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A state machine circuit switching between multiple states, wherein each state has a state value and a corresponding output value, the state machine circuit comprising:
    a state patch circuit, configured to generate a patched predicted state value, a patched output value, and a selection signal according to a current state value and at least one of a second input signal, a predicted state value, and an output value of the state machine circuit;
    a first selection circuit, configured to output the patched predicted state or the predicted state to a register according to the selection signal; and
    a second selection circuit, configured to output the patched output value or the output value according to the selection signal,
    wherein the predicted state value and the output value are generated according to a first input signal and the current state value of the state machine circuit, and the predicted state value and the output value are not generated according to the second input signal,
    wherein the register stores the current state value.

2. The state machine circuit as claimed in claim 1, wherein when an enable signal is de-asserted, the first selection circuit and the second selection circuit output the predicted state value and the output value, respectively.

3. The state machine circuit as claimed in claim 1, wherein the state patch circuit further comprises a patch register configured to store at least one setting value of each of the current state value, the patched output value, the patched predicted state value, and at least one of the second input signal, the predicted state value and the output value.

4. The state machine circuit as claimed in claim 3, wherein the patch register is loaded with data before operation of the state machine circuit.

5. The state machine circuit as claimed in claim 1, wherein the state patch circuit further comprises multiple comparison circuits configured to generate corresponding control signals according to the current state value, at least one of the second input signal, the predicted state value, and the output value, and setting values corresponding thereto, wherein the selection signal is generated according to the control signals.

6. The state machine circuit as claimed in claim 5, wherein the state patch circuit further comprises multiple ignoring signals each corresponding to one of the control signals, wherein when the ignoring signals are asserted, the selection signal is not generated according to the corresponding control signals.

7. The state machine circuit as claimed in claim 5, wherein the state patch circuit further comprises multiple OR gates corresponding to each of the comparison circuits, wherein each of the OR gates generates an output by receiving the control signal of the corresponding comparison circuit.

8. The state machine circuit as claimed in claim 7, wherein the state patch circuit further comprises an AND gate configured to generate the selection signal by receiving the outputs from the OR gates.

9. A state adjusting method for use in a state machine circuit, the state machine circuit comprising a logic circuit and a state patch circuit, wherein the state machine circuit switches between multiple states, and each state has a state value and a corresponding output value, the method comprising:
    generating a predicted state value of the state machine according to a first input signal and a current state value via the logic circuit;
    generating a patched predicted state value and a selection signal according the current state value and at least one of a second input signal, the predicted state value and an output value of the state machine circuit via the state patch circuit; and
    outputting the patched predicted state value or the predicted state value as the current state value after a clock period according to the selection signal,
    wherein the output value is generated according to the first input signal and the current state value, and the predicted state value and the output value are not generated according to the second input signal.

10. The method as claimed in claim 9, further comprising:
generating a patched output value according to the current state value and at least one of the second input signal, the predicted state value, and the output value of the state machine circuit via the state patch circuit; and
outputting the patched output value or the output value according to the selection signal.

11. The method as claimed in claim 9, wherein when an enable signal is de-asserted, outputting the predicted state value according to the selection signal.

12. The method as claimed in claim 9, further comprising:
generating the selection signal by comparing the current state value and at least one of the second input signal, the predicted state value, and the output value with setting values corresponding thereto.

13. The method as claimed in claim 12, further comprising:
generating corresponding control signals by comparing the current state value and at least one of the second input signal, the predicted state value, and the output value with setting values corresponding thereto; and
generating the selection signal according to the control signals and multiple ignoring signals,
wherein each of the ignoring signals corresponds to one of the current state value and at least one of the second input signal, the predicted state value, and the output value,
wherein when the ignoring signals are asserted, the selection signal is not generated according to the corresponding control signals.

14. The method as claimed in claim 9, further comprising:
loading and storing at least one setting value of each of the current state value, the patched predicted state value, and at least one of the second input signal, the predicted state value, and the output value before operation of the state machine circuit.

15. A state adjusting method for use in a state machine circuit, wherein the state machine circuit switches between multiple states, and each state has a state value and a corresponding output value, the method comprising:
generating a predicted state value according to a first input signal and a current state value of the state machine circuit;
generating a patched predicted state value and a selection signal according to the current state value, at least one of a second input signal, a predicted state value, and an output value, and setting values corresponding thereto; and
outputting the patched predicted state value or the predicted state value as the current state value after a clock period according to the selection signal,
wherein the output value is generated according to the first input signal and the current state value, and the predicted state value and the output value are not generated according to the second input signals.

16. The method as claimed in claim 15, further comprising:
generating a patched output value by comparing the current state value and at least one of the second input signal, the predicted state value, and the output value with setting values corresponding thereto; and
outputting the patched output value or the output value according to the selection signal.

17. The method as claimed in claim 15, wherein when an enable signal is de-asserted, outputting the predicted state value according to the selection signal.

18. The method as claimed in claim 15, further comprising:
generating corresponding control signals by comparing the current state value, and at least one of the second input signal, the predicted state value, and the output value with setting values corresponding thereto; and
generating the selection signal according to the control signals and multiple ignoring signals,
wherein the ignoring signals each correspond to one of the current state value, and at least one of the second input signal, the predicted state value, and the output value,
wherein when the ignoring signals are asserted, the selection signal is not generated according to the corresponding control signals.

19. The method as claimed in claim 15, wherein before the comparison step, the method further comprises:
loading and storing at least one setting value of each of the current state value, the patched predicted state value, and at least one of the second input signal, the predicted state value, and the output value before operation of the state machine circuit.

* * * * *